(12) United States Patent
Yeh et al.

(10) Patent No.: US 6,323,073 B1
(45) Date of Patent: Nov. 27, 2001

(54) METHOD FOR FORMING DOPED REGIONS ON AN SOI DEVICE

(75) Inventors: Wen-Kuan Yeh, Chu-Pei; Hua-Chou Tseng, Hsin-Chu; Jiann Liu, Taipei, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/764,399

(22) Filed: Jan. 19, 2001

(51) Int. Cl.$^7$ .................................................. H01L 21/338
(52) U.S. Cl. ............................................... 438/181; 438/311
(58) Field of Search ..................................... 438/181, 197, 438/218, 221, 222, 226, 245, 291, 294, 296, 311, 359, 360, 378, 413, 416, 424, 425, 498, 499

(56) References Cited

U.S. PATENT DOCUMENTS 5,908,313 * 6/1999 Chau et al. ............................ 438/299
6,048,769 * 4/2000 Chau ...................................... 438/275
6,121,100 * 9/2000 Andideh et al. ....................... 438/305
6,165,826 * 12/2000 Chau et al. ............................ 438/231

* cited by examiner

Primary Examiner—David Nelms
Assistant Examiner—David Nhu
(74) Attorney, Agent, or Firm—Winston Hsu

(57) ABSTRACT

An SOI layer has a dielectric layer and a silicon layer formed on the dielectric layer. A shallow trench isolation structure is formed on the silicon layer. The STI structure passes through to the dielectric layer. A thermal diffusion process is performed to drive dopants into a first region of the silicon layer so as to form an N-well or P-well doped region. Next, a thermal diffusion process is performed to drive dopants into a second region of the silicon layer so as to form a P-well or N-well doped region. Finally, an epitaxy layer, having a thickness of about 200 angstroms, is grown on the surface of the silicon layer by way of a molecular-beam epitaxy (MBE) growth process, a liquid-phase epitaxy (LPE) growth process, or a vapor-phase epitaxy (VPE) growth process.

16 Claims, 7 Drawing Sheets

METHOD FOR FORMING DOPED REGIONS ON AN SOI DEVICE

BACKGROUND OF THE INVENTION

1. Field of the Invention

The present invention relates to a method of forming a doped region on a silicon on insulator (SOI) layer, and more particularly, to a method of forming a super steep retrograde (SSR) distribution of the doping concentration in a doped region.

2. Description of the Prior Art

SOI layers are a new technology for the isolation of CMOS devices. Its principle feature is the formation of a dielectric layer on the surface of a substrate, and then the formation of a silicon layer on the dielectric layer. Hence, the silicon layer used to manufacture a CMOS device is separated from the substrate by a dielectric layer, and latch-up, which often occurs in CMOS transistors, is prevented.

Please refer to FIG. 1 to FIG. 5. FIG. 1 is a cross-sectional diagram of an SOI layer structure of the prior art. A dielectric layer 12 and a silicon layer 14 are formed in order on the substrate 10 to form an SOI layer. FIG. 2 to FIG. 5 are cross-sectional diagrams of a method for forming a doped region on an SOI layer of the prior art. The method of the prior art involves first forming a shallow trench isolation structure 16 in a predetermined position of the silicon layer 14. The shallow trench 16 passes through to the dielectric layer 12. Then, as shown in FIG. 3, a dielectric layer 18 or a photoresist layer (not shown) is formed on the predetermined N-well region of the silicon layer 14, and serves as a hard mask. An ion implant process 20 is performed in the predetermined P-well region of the silicon layer 14 to form a P-well 22 doped region.

Then, as shown in FIG. 4, the dielectric layer 18 is removed and a dielectric layer 24 or a photoresist layer (not shown) is formed on the P-well 22 of the silicon layer 14 to serve as a hard mask. An ion implant process 26 is performed in the predetermined N-well region to form an N-well 28 doped region. Finally, as shown in FIG. 5, the dielectric layer 24 is removed and the process of manufacturing doped regions on an SOI layer is finished.

Please refer to FIG. 6. FIG. 6 is a cross-sectional diagram of a PMOS transistor formed in the N-well after forming the doped regions on an SOI layer by the prior art method. Please refer to FIG. 7 and FIG. 8. FIG. 7 is a diagram depicting the doping distribution in the PMOS transistor along the line 2–2' of FIG. 6. FIG. 8 is a diagram depicting the doping distribution in the PMOS transistor along the line 3–3' of FIG. 6. The P-well 22 and the N-well 28 on the SOI layer are used to form NMOS and PMOS transistors to structure each step of the very large scale integration (VLSI) process. As shown in FIG. 7, the diagram illustrates the doping concentration versus depth in the PMOS transistor on the SOI layer formed by the prior art method along the line 2–2'. Experimental results have shown that the channel doping distribution curve 27 of the MOS transistor is relatively uniform and the doping concentration is relatively high on the wafer surface near the gate 34.

This high, uniform doping distribution results in reduced mobility of electrons and holes, and may cause short channel effects (SCE). As shown in the doping distribution curve 29 of FIG. 8, the doping concentration is typically large in both the source 40 and the drain 42. Because the doping concentration at the interface of the source 40 and the N-well 28, or the drain 42 and the N-well 28, is much lower than other source or drain regions, a higher junction capacitance (Cj) may appear at the interface, affecting the electrical performance of the MOS transistor.

SUMMARY OF THE INVENTION

It is therefore a primary objective of the present invention to provide a method of forming doped regions on a SOI layer and to modify the doping concentration distribution in the doped regions.

In a preferred embodiment, the present invention involves first forming a shallow trench isolation (STI) structure in the silicon layer of the SOI substrate. The STI structure passes through to the dielectric layer. A second dielectric layer is formed as a hard mask on the surface of the second region of the silicon layer. A thermal diffusion process is performed to drive dopants into the first region of the silicon layer so as to form an N-well or a P-well doped region. Next, the second dielectric layer is removed and a third dielectric layer is formed as a hard mask on the surface of the first region of the silicon layer. A thermal diffusion process is performed to drive dopants into the second region of the silicon layer so as to form a P-well or an N-well doped region. Finally, the third dielectric layer is removed and an epitaxy layer, having a thickness of about 200 angstroms, is grown on the surface of the silicon layer by way of a molecular-beam epitaxy (MBE) growth process, a liquid-phase epitaxy (LPE) growth process, or a vapor-phase epitaxy (VPE) growth process.

It is an advantage of the present invention that a thermal diffusion process is performed, and an epitaxy layer is grown on the surface of the silicon layer after forming the doped regions. The dopants in the doped regions will gradually diffuse to the epitaxy layer, and the doping concentration distribution in the epitaxy layer and the silicon layer is presented as an SSR distribution curve so as to improve the electrical performance of the MOS transistor.

These and other objectives of the present invention will no doubt become obvious to those of ordinary skill in the art after reading the following detailed description of the preferred embodiment, which is illustrated in the various figures and drawings.

DETAILED DESCRIPTION OF THE PREFERRED EMBODIMENT

Figure 1:
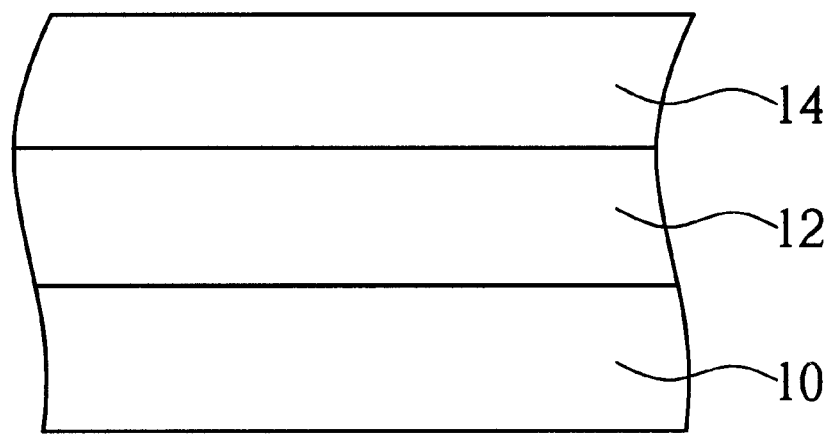
FIG. 1 to FIG. 5 are cross-sectional diagrams of manufacturing doped regions on an SOI layer by a prior art method.
Figure 2:
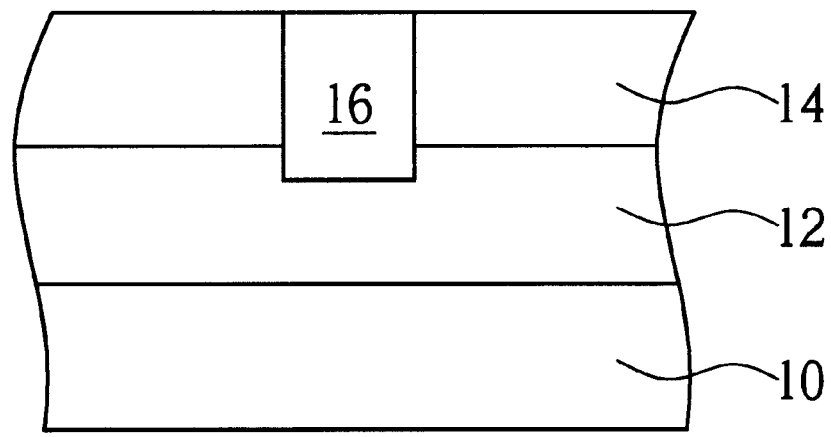
Figure 3:
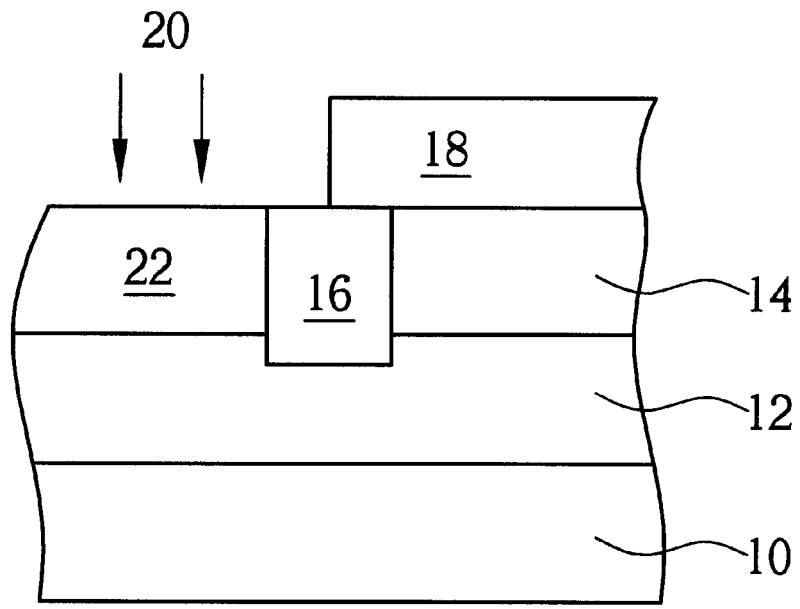
Figure 4:
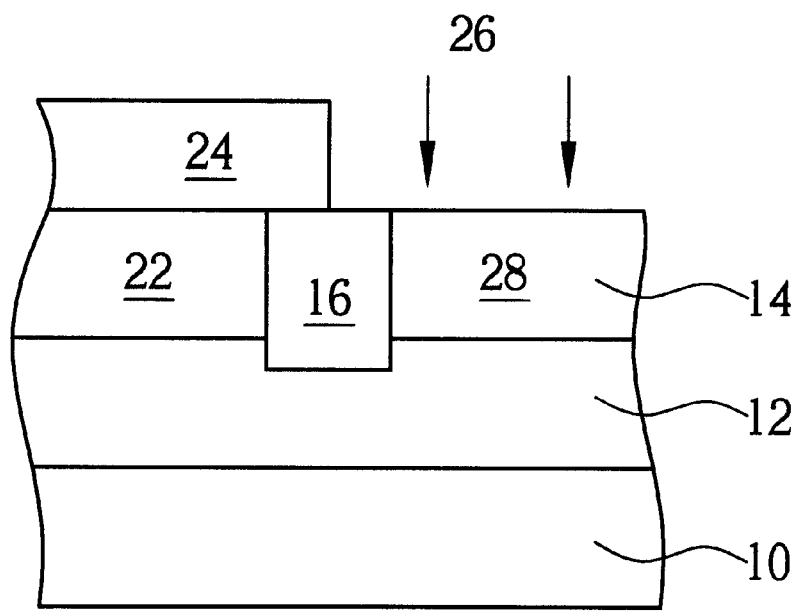
Figure 5:
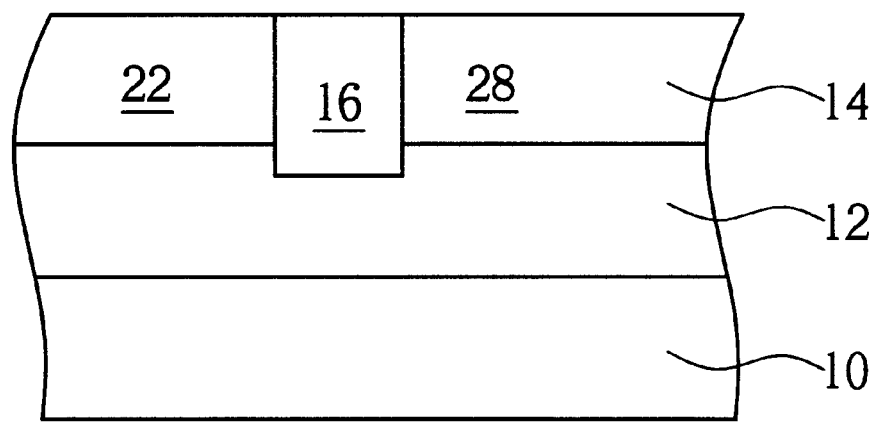
Figure 6:
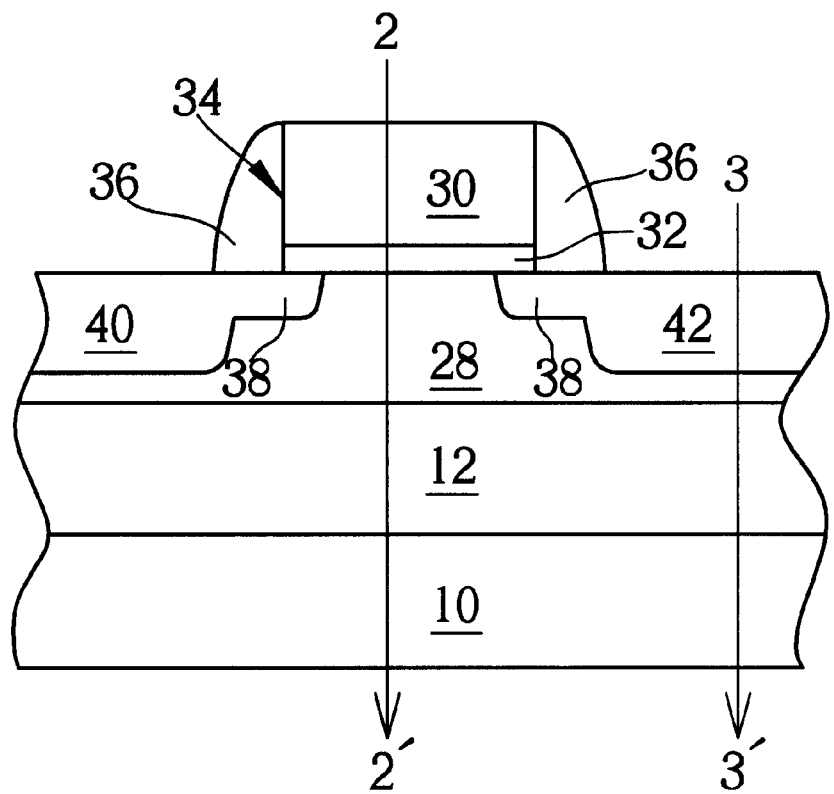
FIG. 6 is a cross-sectional diagram of a PMOS transistor on an SOI layer form ed by a prior art method.
Figure 7:
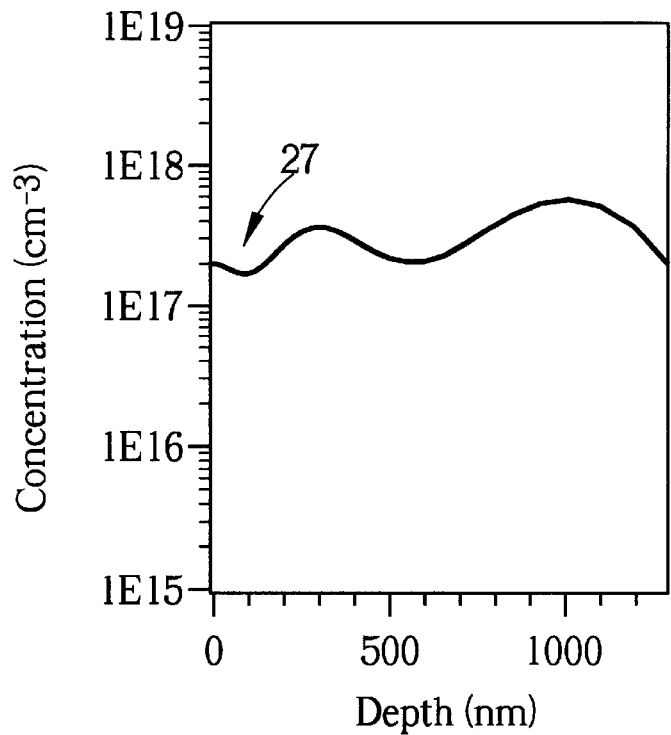
FIG. 7 is a diagram depicting the doping distribution in the MOS transistor along the line 2–2' of FIG. 6.
Figure 8:
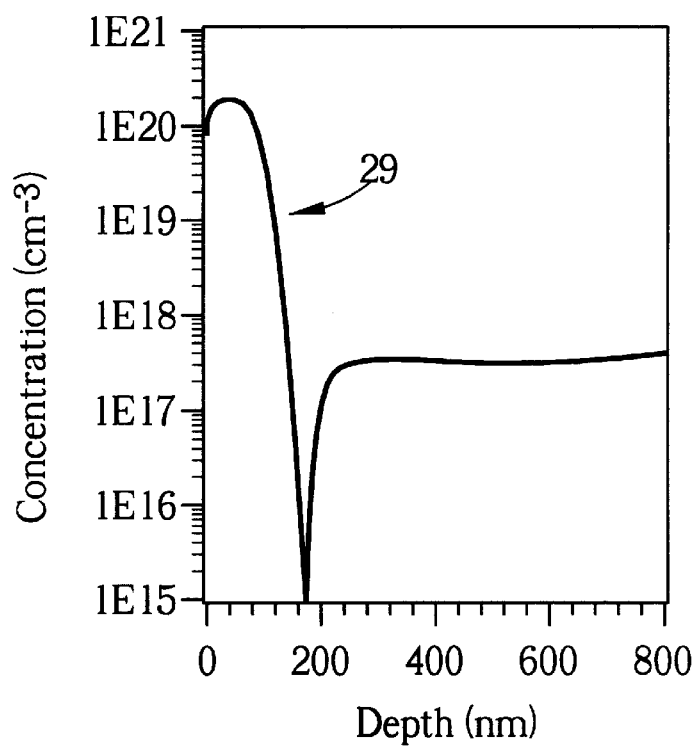
FIG. 8 is a diagram depicting the doping distribution in the MOS transistor along the line 3–3' of FIG. 6.
Figure 9:
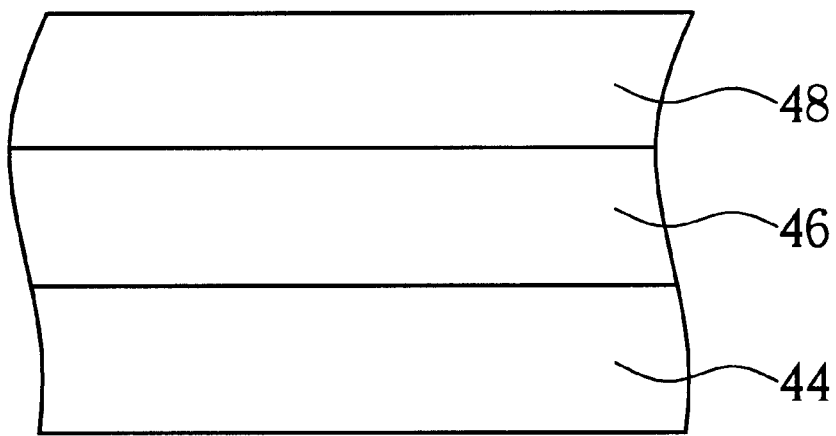
FIG. 9 to FIG. 13 are cross-sectional diagrams of manufacturing doped regions on an SOT layer according to the present invention.

It is a primary objective of the present invention to provide a method of forming doped regions on an SOI layer, and to modify the doping concentration distribution in the doped regions. Please refer to FIG. 9 to FIG. 13. FIG. 9 is a cross-sectional diagram of an SOI layer structure. FIG. 10 to FIG. 13 are cross-sectional diagrams of the method for forming doped regions in an SOI layer according to the present invention. As shown in FIG. 9, the SOI layer is positioned on a substrate 44 made of $Al_2O_3$, $SrTiO_3$, $LaAlO_3$, $SiO_2$, silicon, or an insulation oxide substrate, and comprises a dielectric layer 46 and a silicon layer 48.

Figure 10:
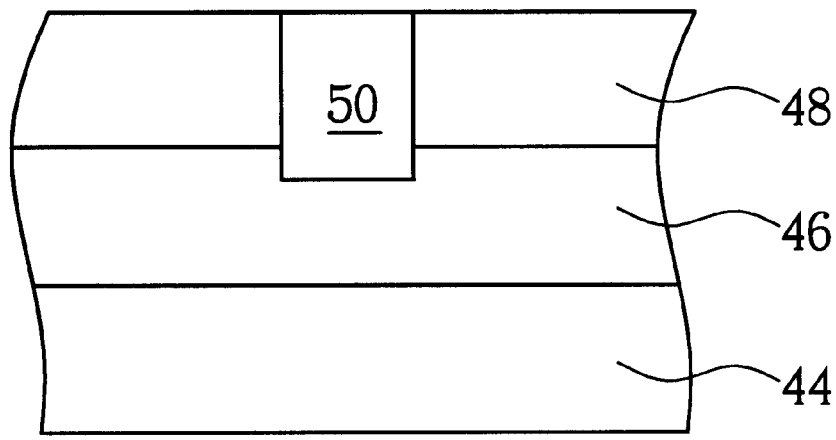
Figure 11:
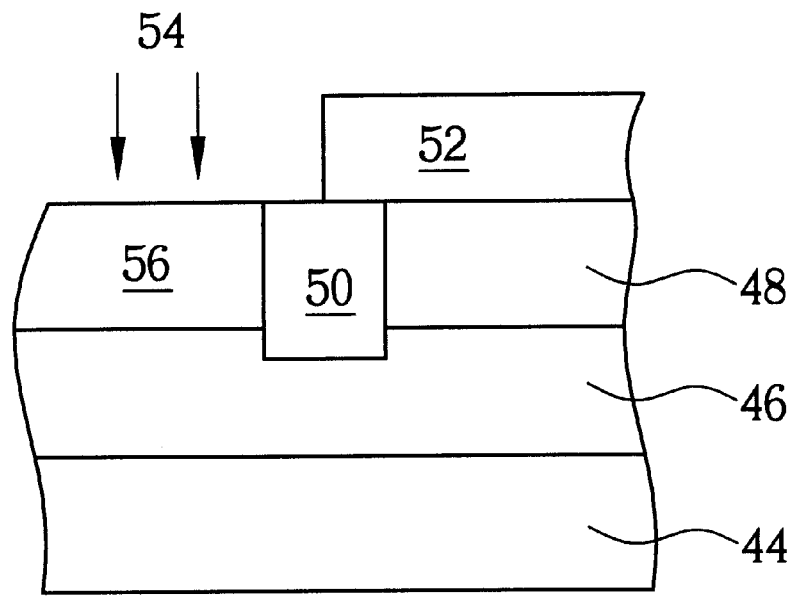
Figure 12:
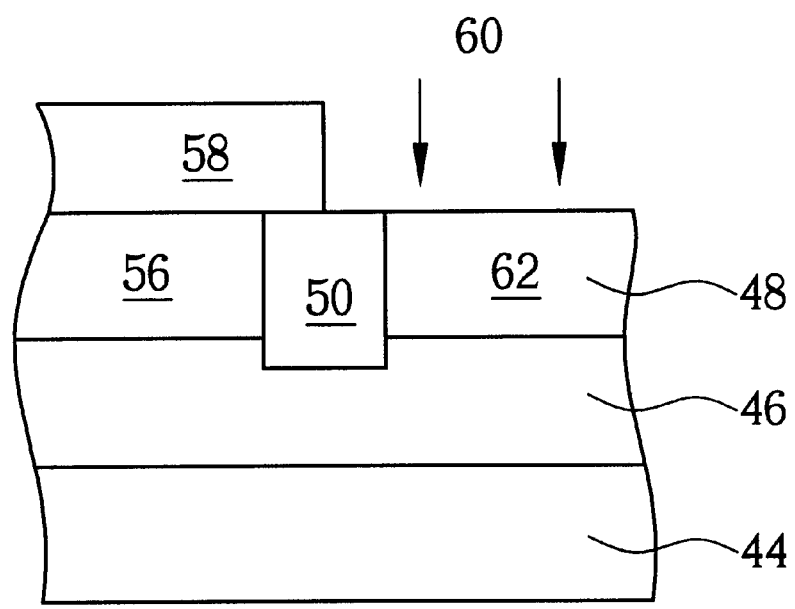

As shown in FIG. 10, the present invention involves first forming an STI structure 50 in a predetermined position of the silicon layer 48. The STI structure 50 passes through to the dielectric layer 46. Then, as shown in FIG. 11, a dielectric layer 52 is formed on the surface of the second region of the silicon layer 48. The dielectric layer 52 is used as a hard mask. A thermal diffusion process 54 is performed on P-type dopants so as to form a P-well 56 doped region in the first region of the silicon layer 48. Next, the dielectric layer 52 is removed and a dielectric layer 58 is formed on the surface of the first region of the silicon layer 48. The dielectric layer 58 serves as a hard mask. A thermal diffusion process 60 is performed on N-type dopants so as to form an N-well 62 doped region in the second region of the silicon layer 48, as shown in FIG. 12. An ion implantation process could replace either thermal diffusion process 54 or 60.

Figure 13:
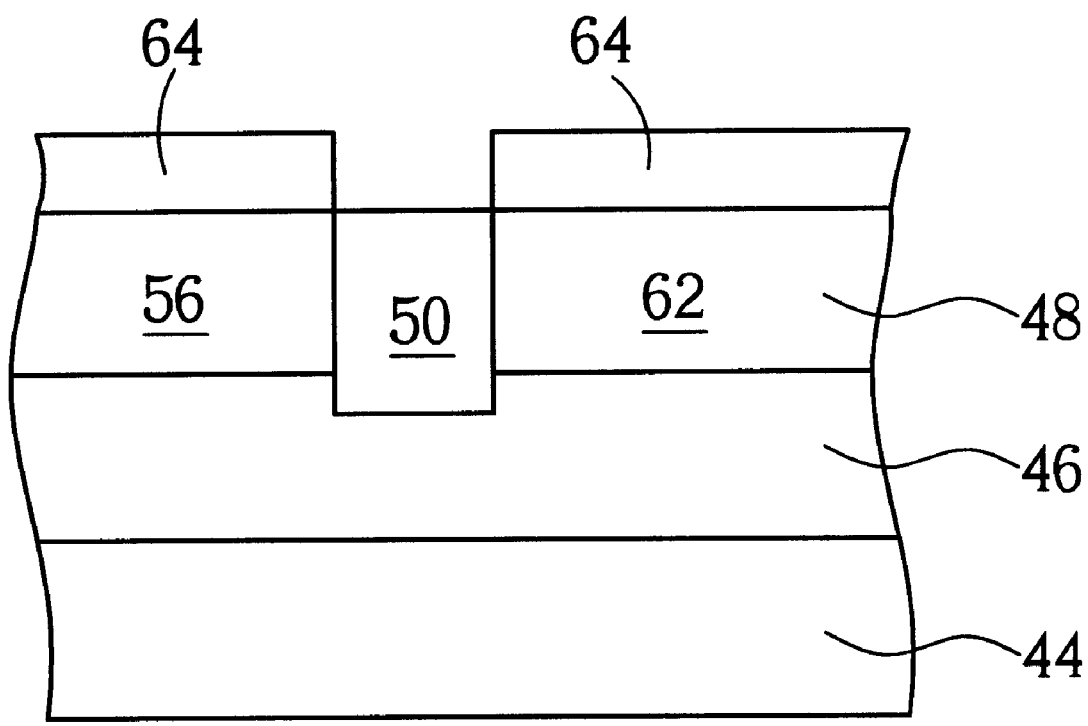

Finally, as shown in FIG. 13, after the dielectric layer 58 is removed, an epitaxy layer 64, having a thickness of about 200 angstroms, is grown on the surface of the silicon layer 48 by way of a molecular-beam epitaxy (MBE) growth process, a liquid-phase epitaxy (LPE) growth process, or a vapor-phase epitaxy (VPE) growth process.

When the epitaxy layer 64 is formed, the high temperature of the epitaxy process will diffuse dopants in the P-well 56 or N-well 62 under the epitaxy layer 64 into the epitaxy layer 64. Moreover, the newly formed epitaxy layer 64 gives the surface of the SOI layer a more complete lattice structure. Furthermore, there are no oxygen atoms of the removed pad oxide layer formed in the STI process contaminating the epitaxy layer 64, so gate oxide layers and salicide layers formed in later processes will be of a good quality.

In contrast to the prior method of forming doped regions in the SOI layer, the present invention involves first forming a P-well and an N-well doped region by way of thermal diffusion processes. An epitaxy layer, having a thickness of about 200 angstroms, is then grown on the surface of the silicon layer. Dopants diffusing from the doped regions to the epitaxy layer are used to modify the doping concentration of the SOI layer surface. In this manner, the doping concentration distribution presents an SSR distribution curve. Under the SSR distribution, the doping concentration is reduced in the region near the gate. This enhances the mobility of the electrons and holes in the channel, significantly improving the current velocity over the prior art. Additionally, short channel effects (SCE) are prevented. The junction capacitance (Cj) at the interface of the source and the well, and the drain and the well is also reduced, thus enhancing the electrical performance of the MOS transistor.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for forming doped regions on a silicon on insulator (SOI) device, the SOI device positioned on a substrate, the SOI device comprising a first dielectric layer, a silicon layer positioned on the first dielectric layer, and a shallow trench isolation (STI) structure in the silicon layer passing through to the first dielectric layer, the method comprising:

performing a first thermal diffusion process to drive dopants into a first region of the silicon layer so as to form a first conductive type doped region;

performing a second thermal diffusion process to drive dopants into a second region of the silicon layer so as to form a second conductive type doped region; and growing an epitaxy layer on the surface of the silicon layer;

wherein the dopants in the doped regions diffuse into the epitaxy layer, and the doping concentration distribution in the epitaxy layer and the silicon layer presents a Super Steep Retrograde (SSR) distribution curve 90 as to improve the electrical performance of the MOS transistor.

2. The method of claim 1 wherein the substrate is made of $Al_2O_3$, $SrTiO_3$, $LaAlO_3$, $SiO_2$, silicon, or an insulation oxide substrate.

3. The method of claim 1 wherein the first conductive type doped region is an N-well, and the second conductive type doped region is a P-well.

4. The method of claim 1 wherein the first conductive type doped region is a P-well, and the second conductive type doped region is an N-well.

5. The method of claim 1 wherein the method for forming the first conductive type doped region and the second conductive type doped region comprises:

forming a second dielectric layer on the surface of the second region of the silicon layer;

using the second dielectric layer as a hard mask to drive first conductive type dopants into the first region of the silicon layer so as to form the first conductive type doped region;

removing the second dielectric layer;

forming a third dielectric layer on surface of the first region of the silicon layer;

using the third dielectric layer as a hard mask to drive second conductive type dopants into the second region of the silicon layer so as to form the second conductive type doped region; and removing the third dielectric layer.

6. The method of claim 1 wherein the epitaxy layer is formed by a molecular-beam epitaxy (MBE) growth process, a liquid-phase epitaxy (LPE) growth process, or a vapor-phase epitaxy (VPE) growth process.

7. The method of claim 1 wherein the epitaxy layer has a thickness of about 200 angstroms.

8. A method for forming doped regions on a silicon on insulator (SOI) device, the SOI device positioned on a substrate, the SOI device comprising a dielectric layer, a silicon layer positioned on the dielectric layer, and a shallow trench isolation (STI) structure in the silicon layer passing through to the dielectric layer, the method comprising:

forming a first conductive type doped region and a second conductive type doped region on the silicon layer; and growing an epitaxy layer on the surface of the silicon layer;

wherein the dopants in the doped regions diffuse into the epitaxy layer, and the doping concentration distribution in the epitaxy layer and the silicon layer presents a SSR distribution curve so as to improve the electrical performance of the MOS transistor.

9. The method of claim 8 wherein the substrate is made of $Al_2O_3$, $SrTiO_3$, $LaAlO_3$, $SiO_2$, silicon, or an insulation oxide substrate.

10. The method of claim 8 wherein the first conductive type doped region is an N-well, and the second conductive type doped region is a P-well.

11. The method of claim 8 wherein the first conductive type doped region is a P-well, and the second conductive type doped region is an N-well.

12. The method of claim 8 wherein the silicon layer further comprises a first region used to form the first conductive doped region, and a second region used to form the second conductive doped region, and the method for forming the first conductive type doped region and the second conductive type doped region comprises:

forming a first mask on surface of the second region;

performing a first doping process to the first region so as to form the first conductive type doped region;

removing the first mask;

forming a second mask on surface of the first region;

performing a second doping process to the second region so as to form the second conductive type doped region; and removing the second mask.

13. The method of claim 12 wherein the first doping process and the second doping process are both thermal diffusion processes, and the first mask and the second mask are both made of dielectric layers.

14. The method of claim 12 wherein the first doping process and the second doping process are both ion implantation processes.

15. The method of claim 8 wherein the epitaxy layer is formed by a molecular-beam epitaxy (MBE) growth process, a liquid-phase epitaxy (LPE) growth process, or a vapor-phase epitaxy (VPE) growth process.

16. The method of claim 8 wherein the epitaxy layer has a thickness of about 200 angstroms.

* * * * *